United States Patent
Tan

(10) Patent No.: US 12,519,090 B2
(45) Date of Patent: Jan. 6, 2026

(54) METHOD OF FORMING A MONOLITHIC LIGHT EMITTING DIODE PRECURSOR

(71) Applicant: PLESSEY SEMICONDUCTORS LIMITED, Plymouth (GB)

(72) Inventor: Wei Sin Tan, Plymouth (GB)

(73) Assignee: Plessey Semiconductors Limited, Plymouth (GB)

( * ) Notice: Subject to any disclaimer, the term of this patent is extended or adjusted under 35 U.S.C. 154(b) by 784 days.

(21) Appl. No.: 17/783,319

(22) PCT Filed: Dec. 3, 2020

(86) PCT No.: PCT/EP2020/084546
§ 371 (c)(1),
(2) Date: Jun. 8, 2022

(87) PCT Pub. No.: WO2021/115934
PCT Pub. Date: Jun. 17, 2021

(65) Prior Publication Data
US 2023/0019237 A1    Jan. 19, 2023

(30) Foreign Application Priority Data

Dec. 12, 2019  (GB) ...................................... 1918318

(51) Int. Cl.
*H01L 25/075* (2006.01)
*H10H 20/01* (2025.01)
(Continued)

(52) U.S. Cl.
CPC ... *H01L 25/0753* (2013.01); *H10H 20/01335* (2025.01); *H10H 20/0137* (2025.01); *H10H 20/812* (2025.01); *H10H 20/821* (2025.01)

(58) Field of Classification Search
CPC ........... H10H 20/821; H10H 20/01335; H10H 20/0137; H10H 20/812
See application file for complete search history.

(56) References Cited

U.S. PATENT DOCUMENTS

| | | |
|---|---|---|
| 2003/0141507 A1 | 7/2003 | Krames et al. |
| 2007/0054467 A1 | 3/2007 | Currie et al. |
| (Continued) | | |

FOREIGN PATENT DOCUMENTS

| | | |
|---|---|---|
| CN | 102130230 A | 7/2011 |
| JP | 2009094228 A | 4/2009 |

OTHER PUBLICATIONS

International Search Report, PCT/EP2020/084546, dated Mar. 11, 2021, 4 pages.
(Continued)

*Primary Examiner* — Trang Q Tran
(74) *Attorney, Agent, or Firm* — Stinson LLP

(57) ABSTRACT

A method of forming a monolithic LED precursor is provided. The method comprises: providing a substrate having a top surface; forming a first semiconductor layer comprising a Group III-nitride on the top surface of the substrate; selectively masking the first semiconductor layer with a LED mask layer, the LED mask layer comprising an aperture defining a LED well through a thickness of the LED mask layer to an unmasked portion of the first semiconductor layer, the LED well comprising LED well sidewalls extending from a top surface of the first semiconductor layer to a top surface of the LED mask layer; and selectively forming a monolithic LED stack within the LED well on the unmasked portion of the first semiconductor layer. The monolithic LED stack comprises a n-type semiconductor layer comprising a Group III-nitride formed on the first semiconductor layer, an active layer formed on the first semiconductor layer comprising one or more quantum well sub-layers, the active layer comprising a Group III-nitride, and a p-type semiconductor layer comprising a Group III-nitride formed on the second semiconductor layer. The LED stack sidewalls of the monolithic LED stack extend (Continued)

from the top surface of the first semiconductor layer conform to the LED well sidewalls of the LED mask layer.

12 Claims, 6 Drawing Sheets

(51) Int. Cl.
*H10H 20/812* (2025.01)
*H10H 20/821* (2025.01)

(56) References Cited

U.S. PATENT DOCUMENTS

| | | |
|---|---|---|
| 2009/0159870 A1 | 6/2009 | Lin et al. |
| 2009/0298214 A1 | 12/2009 | Paek et al. |
| 2011/0254031 A1 | 10/2011 | Yan et al. |
| 2020/0313033 A1 | 10/2020 | Tou et al. |
| 2022/0384395 A1* | 12/2022 | Tan .................... H10H 20/0137 |

OTHER PUBLICATIONS

Written Opinion, PCT/EP2020/084546, dated Mar. 11, 2021, 8 pages.
Search Report for Taiwanese Application No. 109143011, dated Aug. 3, 2020, 9 pages.
Great Britain Search Report, Application No. GB1918318.5, dated May 20, 2020, 9 pages.

* cited by examiner

METHOD OF FORMING A MONOLITHIC LIGHT EMITTING DIODE PRECURSOR

REFERENCE TO RELATED APPLICATIONS

This application is the 371 U.S. national stage application of International Patent Application No. PCT/EP2020/084546, filed Dec. 3, 2020, which claims the benefit of Great Britain Patent Application No. 1918318.5, filed Dec. 12, 2019, the entire disclosures of which are incorporated herein by reference.

FIELD OF THE DISCLOSURE

The present disclosure relates to light emitting diodes (LEDs). In particular, the present disclosure relates to LEDs comprising Group III-nitrides.

BACKGROUND

Micro LED arrays are commonly defined as arrays of LEDs with a size of 100×100 $\mu m^2$ or less. Micro LED arrays are a self-emitting component in a micro-display/projector which are suitable for use in a variety of devices such as smartwatches, head-wearing displays, head-up displays, camcorders, viewfinders, multisite excitation sources, and pico-projectors.

One type of micro LED array comprises a plurality of LEDs formed from Group III-nitrides. Group III-nitride LEDs are inorganic semiconductor LEDs comprising, for example, GaN and its alloys with InN and AlN in the active light-emitting region. Group III-nitride LEDs can be driven at significantly higher current density and emit a higher optical power density than conventional large-area LEDs, for example organic light emitting diodes (OLED) in which the light-emitting layer is an organic compound.

In one known process for the fabrication of a LED comprising Group III-nitrides, such as disclosed in Wong, M. S, "*High efficiency of III-nitride micro-light emitting diodes by sidewall passivation using atomic layer deposition*" Optics express, Vol. 26, No. 16, 6 Aug. 2018, a micro LED structure and an ITO contact layer are deposited across a sapphire substrate. Individual micro LED mesa structures were then defined using reactive ion etching step in which portions of the ITO layer and micro LED structure are removed. Such an etching process results in micro LED structures extending from the substrate with exposed sidewall surfaces. The RIE step introduces defects into the sidewall surfaces of the micro LED mesa such that charge trapping sites are present on the sidewall surfaces. The presence of trap sites on the sidewall surface reduces the external quantum efficiency (EQE) of the micro LED.

As the surface dimensions of an LED are reduced down to micro LED sizes, the ratio of LED perimeter to LED surface area is increased. Thus, sidewall surfaces which may include defects resulting from etching have a more significant effect on device EQE.

As explained in Wong, M. S, et al. one method for improving the EQE of micro LEDs is to deposit a dielectric passivation layer over the sidewall surfaces. For example, a dielectric passivation layer comprising $SiO_2$ may be used to cover the sidewall surfaces of a LED mesa structure to try to passivate sidewall defects.

An alternative process for forming a LED comprising Group III-nitrides uses a selective area growth (SAG) process. For example, UK patent application GB 1811109.6 discloses growth of a LED precursor through an aperture of a mask layer. Each LED precursor is formed as a column having a regular trapezoidal cross-section normal to the substrate. The material in the mask is such that the at the growth conditions, no additional material is grown directly on the mask but only on exposed portions of the surface of the underlying buffer layer. Another noteworthy feature of selective area growth of Group III-nitrides grown along the [0001] direction is that depending on the growth parameters such as growth temperature, pressure, and V/III ratio, inclined facets with respect to the (0001) plane also known as c-plane are obtained around the perimeter of the growing portions of c-plane semiconductor as defined by the open areas of the patterned mask. The inclined facets are generally oriented along the {10 1} or {10 2} planes of the wurtzite crystal and present reduced polarisation fields compared with c-plane surfaces (semi-polar surfaces). As such, the inclined facets (sidewalls) of the LED precursor are not formed by an etching step.

It is an object of the present invention to provide an improved method for forming a LED precursor, as well as improved LED precursors which tackle at least one of the problems associated with prior art methods and arrays, or at least, provide a commercially useful alternative thereto.

SUMMARY

An object of the present invention is to provide a LED precursor with improved EQE. As such, it is an object of the present invention to form the LED structure using a process which does not introduce defects into the sidewalls of the LED structure, for example defects resulting from an etching step.

According to a first aspect of the disclosure, a method of forming a monolithic LED precursor is provided. The method comprises:
(a) providing a substrate having a top surface;
(b) forming a first semiconductor layer comprising a Group III-nitride on the top surface of the substrate;
(c) selectively masking the first semiconductor layer with a LED mask layer, the LED mask layer comprising an aperture defining a LED well through a thickness of the LED mask layer to an unmasked portion of the first semiconductor layer, the LED well comprising LED well sidewalls extending from a top surface of the first semiconductor layer to a top surface of the LED mask layer;
(d) selectively forming a monolithic LED stack within the LED well on the unmasked portion of the first semiconductor layer, the monolithic LED stack comprising:
a n-type semiconductor layer comprising a Group III-nitride formed on the first semiconductor layer;
an active layer formed on the first semiconductor layer comprising one or more quantum well sub-layers, the active layer comprising a Group III-nitride;
a p-type semiconductor layer comprising a Group III-nitride formed on the second semiconductor layer;
wherein LED stack sidewalls of the monolithic LED stack extending from the top surface of the first semiconductor layer conform to the LED well sidewalls of the LED mask layer.

The LED stack sidewalls of the monolithic LED stack are formed against the LED well sidewalls of the LED mask layer. As such, the LED stack sidewalls are shaped by the LED mask layer. Accordingly, the monolithic LED stack may be formed and shaped without etching of the LED stack sidewalls such that no etching induced damage is introduced into the monolithic LED stack. By reducing, or eliminating damage to the LED stack sidewalls during the fabrication process, the EQE of the resulting LED may be improved.

The cross-sectional shape of the monolithic LED stack in a plane normal to the first semiconductor layer is controlled by the cross-sectional shape of the LED well in the LED mask layer. Thus, unlike in the SAG process, the shape of the sidewalls of the LED structure may be controlled to provide different geometries based on the cross-sectional shape of the LED mask sidewalls defining the LED well. That is to say, the cross sectional area of the monolithic LED stack on the first semiconductor layer conforms to the cross-sectional area of the unmasked portion of the first semiconductor layer exposed by the LED well (i.e. the cross-sectional area of the LED well). By contrast, in the SAG process, the LED is formed on top of the mask layer such that the shape and size of the cross-section of the LED is different to the mask aperture.

The presence of the LED mask layer during the fabrication of the monolithic LED stack results in the formation of LED stack sidewalls surfaces which are in direct contact with the LED mask sidewalls. As such, the LED stack sidewalls are formed with a passivation layer (the LED mask sidewalls) already in place. Accordingly, the method of forming a LED precursor may provide a LED precursor with improved EQE using an efficient, economic fabrication method.

In some embodiments, selectively masking the first semiconductor layer with a LED mask layer comprises: depositing the LED mask layer across the top surface of the first semiconductor layer; and selectively removing a first portion of the LED mask layer through a thickness of the LED mask layer to form the LED well. As such, the LED mask layer may be formed using a lithographic technique.

In some embodiments, the LED well sidewalls extend in a direction generally normal to the top surface of the first semiconductor layer. Accordingly, the monolithic LED stack may be formed with LED stack sidewalls which extend in a direction generally normal to the top surface of the first semiconductor layer. By contrast, in the SAG process the sidewalls of the LED may be inclined relative to the normal as a result of the growth process.

In some embodiments, a portion of the LED well sidewalls extending between the first semiconductor layer and the top surface of the LED mask layer are inclined with respect to the direction normal to the top surface of the first semiconductor layer. For example, in some embodiments, the LED well sidewalls may comprise a first portion which extends generally normal to the first semiconductor layer, and a second portion which extends in a direction which is inclined with respect to the direction normal to the top surface of the first semiconductor layer. The first portion may be arranged between the second portion and the top surface of the first semiconductor layer, or vice versa. In some embodiments, substantially all of the LED well sidewalls may be inclined with respect to the direction normal to the top surface of the first semiconductor layer.

In some embodiments, the portion of the LED well sidewall may be inclined such that a cross sectional area of the LED well in a plane parallel to the top surface of the first semiconductor layer decreases in the direction from the top surface of the first semiconductor layer towards the top surface of the LED mask layer. Alternatively, the portion of the LED well sidewall may be inclined such that a cross sectional area of the LED well in a plane parallel to the top surface of the first semiconductor layer increases in the direction from the top surface of the first semiconductor layer towards the top surface of the LED mask layer. As such, the LED well sidewalls may be shaped to define features of the resulting monolithic LED stack which improve the extraction of light from the LED. For example, a decreasing surface area may provide a light collimating feature.

In some embodiments, a collimating portion of each LED well sidewall extending from the first semiconductor layer extends in a direction generally normal to the first semiconductor layer; and a tapered portion of each LED well sidewall extending between the collimating portion and the top surface of the LED mask layer is inclined such that a cross sectional area of the LED well in a plane parallel to the top surface of the first semiconductor layer decreases in the direction from the top surface of the first semiconductor layer towards the top surface of the LED mask layer.

In some embodiments, the method of the first aspect further comprises:
(f) removing a second portion of the LED mask layer from the top surface of the LED mask layer such that the LED mask layer forms a planarised surface with a top surface of the monolithic LED stack.

As such, a portion of the LED mask layer used to shape the monolithic LED stack may be retained during the fabrication process to act as a gap-filling insulator which also passivates the LED stack sidewalls. By not removing the portion of the LED mask layer in contact with the LED stack sidewalls, damage to the LED stack sidewalls may be reduced and/or prevented, and the fabrication process may be simplified.

In some embodiments, the second portion of the LED mask layer is removed using a polishing process. In other embodiments, a selective etchant may be used to remove the LED mask layer. As such, only the LED mask layer may be selectively removed, without etching the monolithic LED stack.

In some embodiments, the method of the first aspect further comprises:
(f) selectively removing all of the LED mask layer following the forming of the monolithic LED stack.

As such, all of the LED mask layer may be removed following formation of the monolithic LED stacks. The method may also further comprise depositing a gap filling insulator on the top surface of the of the first semiconductor layer surrounding the monolithic LED stack, the gap filling insulator forming a planarised surface with a top surface of the monolithic LED stack.

Once a planarised surface is formed, the method may further comprise:
(g) bonding the planarised surface of the LED precursor to a further substrate comprising backplane electronic devices; and optionally
(h) removing the substrate from the first semiconductor layer.

As such, the LED precursor of the first aspect may be fabricated such that it is compatible with a flip-chip bonding surface. In particular, in some embodiments, the LED precursor may be fabricated and prepared for substrate bonding to a backplane electronics device without the use of an etching step.

In some embodiments, the LED mask layer comprises a dielectric, for example $SiO_2$, or $SiN_x$.

In some embodiments, a cross sectional area of the LED well on the first semiconductor layer is no greater than 100 µm×100 µm. As such, the method of the first aspect may be used to fabricate micro-LED precursors. In particular, a cross sectional area of the LED well on the first semiconductor layer may be no greater than 50 µm×50 µm, 30

μm×30 μm, 20 μm×20 μm, 10 μm×10 μm, 5 μm×5 μm, 2 μm×2 μm or 1 μm×1 μm, such that a micro-LED precursor of a corresponding cross sectional area is fabricated according to the method of the first aspect.

According to a second aspect of the disclosure, a method of fabricating a LED array precursor is provided. The method comprises forming a plurality of LED precursors on a substrate according to the method of the first aspect of the disclosure.

As such, the method of the second of aspect may incorporate any of the optional features listed above.

BRIEF DESCRIPTION OF THE FIGURES

The disclosure will now be described in relation to the following non-limiting figures. Further advantages of the disclosure are apparent by reference to the detailed description when considered in conjunction with the figures in which.

DETAILED DESCRIPTION

According to an embodiment of the disclosure, a method 100 of forming a LED precursor is provided. The LED precursor comprises a plurality of Group III-nitride layers. A flow diagram of the method 100 is shown in FIG. 1.

By the term "precursor" in LED precursor, it is noted that the LED precursor described does not necessarily include the electrical contacts for each LED such as to allow the emission of light, nor the associated circuitry. Of course, the LED precursor and method of forming thereof does not preclude the addition of further electrical contacts and associated circuitry. As such use of the term precursor in this disclosure is intended to include the finalised product (i.e. a LED, LED array etc.).

This disclosure refers to various top surfaces of layers of the LED precursor. In this disclosure, the concept of a top surface is considered to be relative to the substrate 10 on which the LED precursor is formed. That is to say, a top surface of a layer is the surface of the respective layer which is furthest away from the substrate 10 in a direction normal to the substrate.

Figure 1:
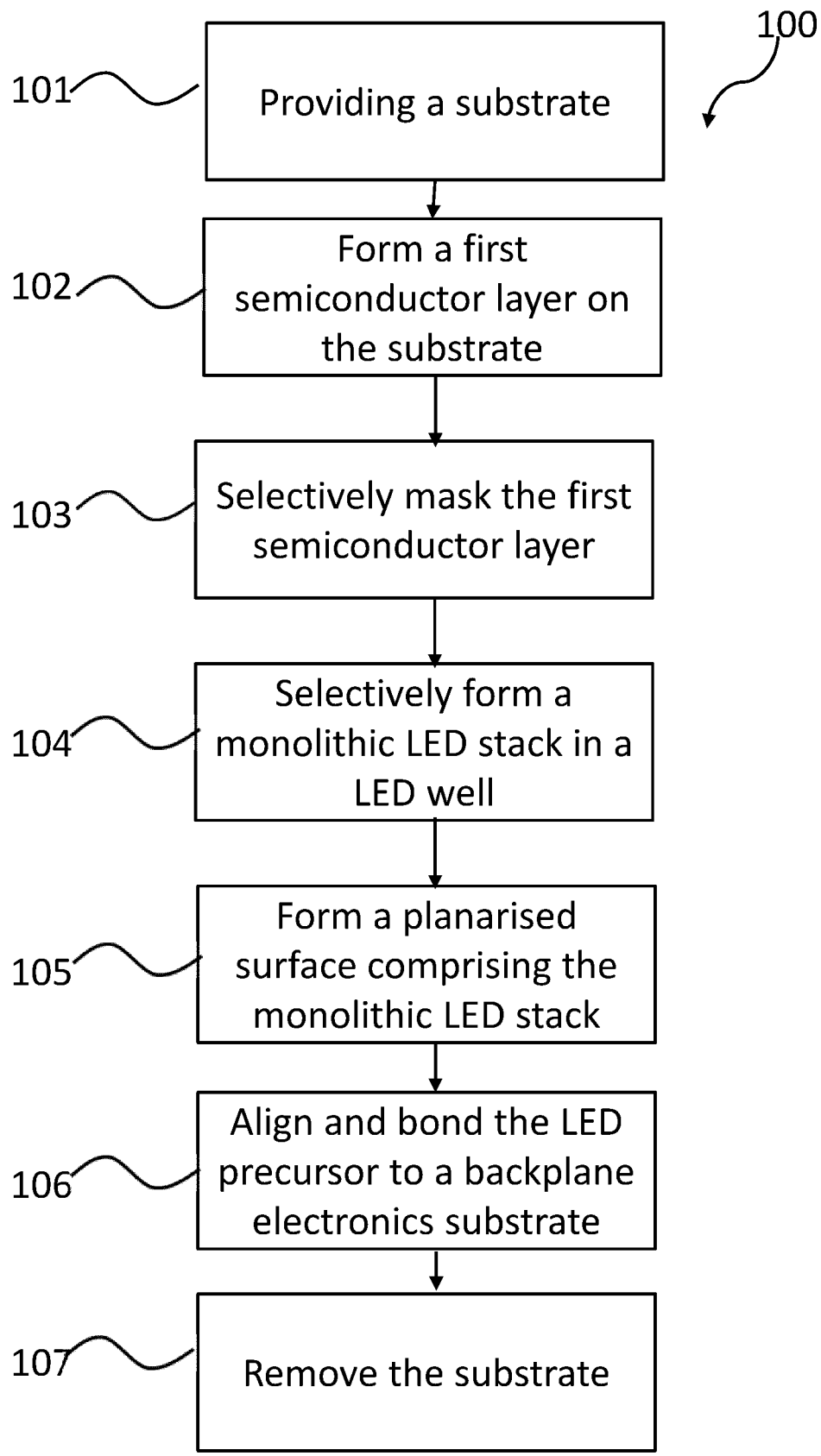
FIG. 1 shows a flow chart of a method of forming a LED array according to an embodiment of the disclosure.

As shown in FIG. 1, the method 100 comprises the steps:
(a) Providing a substrate (101);
(b) Forming a first semiconductor layer on the substrate (102);
(c) Selectively masking the first semiconductor layer (103)
(d) Selectively forming a monolithic LED stack in a LED well (104);
(e) Forming a planarised surface comprising the monolithic LED stack (105);
(f) Aligning and bonding the LED precursor to a backplane electronics substrate (106);
(g) Removing the substrate (107).

In step 101, a substrate 10 is provided. The substrate 10 may be any substrate suitable for use with Group III-nitride semiconductor layers. For example, the substrate 10 may be formed from a range of materials including silicon, GaN, sapphire, silicon carbide, SiO2, or any other known substrate 10 material known in the art. In some embodiments, the substrate may comprise a Si-wafer, a sapphire wafer, or a SiC wafer. The substrate 10 comprises a top surface 12 suitable for the formation of Group III-nitride layers thereon.

In step 102, a first semiconductor layer 20 is formed on the top surface 12 of the substrate 10. The first semiconductor layer 20 comprises a Group III-nitride. In some embodiments, the first semiconductor layer 20 comprises GaN. In some embodiments, the first semiconductor layer 20 may be doped n-type. For example, the first semiconductor layer may comprise n-type doped GaN. The n-type dopant may be any suitable n-type dopant for Group III-nitrides, for example Si or Ge. The first semiconductor layer 20 may be n-type doped with a donor density of about $10^{16}$-$10^{19}$ cm$^{-3}$.

The first semiconductor layer 20 may be provided across substantially the entire top surface 12 of the substrate 10 as a continuous layer. The first semiconductor layer 20 comprises a top surface 22 which is generally aligned with the top surface 12 of the substrate 10. As such, the top surface 22 of the first semiconductor layer 22 is on an opposite side of the first semiconductor layer 20 to the top surface 12 of the substrate 10.

The first semiconductor layer 20 may be deposited by any suitable deposition technique known in the art for forming Group III-nitride layers. For example, the first semiconductor layer 20 comprising n-type doped GaN may be deposited by Metal Organic Chemical Vapour Deposition (MOCVD), Molecular Beam Epitaxy (MBE), hydride vapour phase epitaxy (HVPE) or Remote Plasma Chemical Vapour Deposition (RPCVD).

In some embodiments, the first semiconductor layer 20 may have a thickness in the direction normal to the substrate surface of at least 500 nm. Thus, the first semiconductor layer 20 may provide a generally uniform layer on the substrate 10 which is suitable for the formation of a plurality of LED precursors thereon. In some embodiments, the first semiconductor layer 20 may have a thickness normal to the substrate surface 12 of at least: 700 nm, 1 µm, 1.3 µm, or 1.5 µm. In some embodiments, the first semiconductor layer 20 may have a thickness normal to the substrate surface 12 of no greater than 2 µm.

Figure 2:
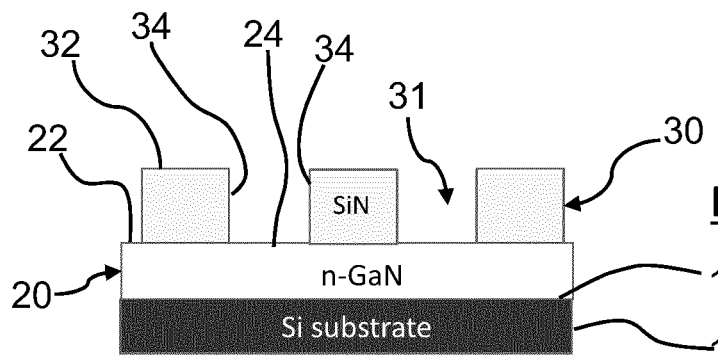
FIG. 2 shows a diagram of a LED mask layer comprising a plurality of LED wells formed on a first semiconductor layer.

In step 103, a LED mask layer 30 is selectively formed on the top surface of the first semiconductor layer 20. As shown in FIG. 2, the LED mask layer 30 is selectively formed in order to define a plurality of LED wells 31 through a thickness of the LED mask layer 30 to an unmasked portion 24 of the first semiconductor layer 20.

In some embodiments, selectively masking the first semiconductor layer 20 with a LED mask layer 30 comprises depositing the LED mask layer across the top surface 22 of the first semiconductor layer 20. For example, in some embodiments, the LED mask layer 30 is formed initially as a substantially continuous layer across the top surface 22 of the first semiconductor layer 20. Then, a first portion of the LED mask layer 30 is selectively removed through a thickness of the LED mask layer 30 to form the LED well 31. For example, the LED mask layer 30 may be selectively etched to remove portions of the LED mask layer 30 in order to define each of the LED wells 31. In other embodiments, the first semiconductor layer 30 may be selectively patterned using a suitable pattern layer, followed by deposition of the LED mask layer 30 on to exposed portions of the first semiconductor layer 20. The pattern layer may then be removed to define the LED wells 31 as shown in FIG. 2. As such, it will be appreciated that the apertures of the LED mask layer 30 may be formed by lithographic methods known in the art.

The LED mask layer 30 comprises a plurality of apertures. Each aperture defines an LED well 31 through a thickness of the LED mask layer 30. Each LED well defines a container volume in which the LED precursor (i.e. the monolithic LED stack) is formed. As shown in FIG. 2, each LED well 31 comprises LED well sidewalls 34 which extend from the top surface 22 of the first semiconductor layer 20 to a top surface of the LED mask layer 32. The LED well sidewalls 34 define the LED wells 31.

The LED mask layer 30 may comprise a material which is an electrical insulator. In particular, the LED mask layer 30 may comprise a material on which the growth rate of Group III-nitrides are significantly reduced relative to the growth rate on the first semiconductor layer 20. For example, the LED mask layer may comprise: $SiN_x$, SiON, or $SiO_2$.

The apertures in the LED mask layer 30 defining each of the LED wells 31 define the shape of the monolithic LED stack formed therein. The shape and size of the apertures (LED well 31) in the plane of the top surface 22 of the first semiconductor layer 20 (and plane parallel to this) defines the surface area of the LED. The cross sectional shape of each LED well may be any two-dimensional shape desired. For example, the cross-sectional shape of the LED well 31 may be elliptical, triangular, rectangular, pentagonal, hexagonal or any other polygon (regular or irregular).

In some embodiments, the LED precursor is a micro LED precursor. Accordingly, the cross-sectional shape of each LED well 31 may define a cross sectional area which is no greater than 100 µm×100 µm (i.e. the shape fits within a 100 µm×100 µm area). In some embodiments, the cross-sectional shape of each LED well 31 may be no greater than: 50 µm×50 µm, 30 µm×30 µm, 20 µm×20 µm, 10 µm×10 µm, 5 µm×5 µm, 2 µm×2 µm, or 1 µm×1 µm. As such, micro LEDs may be formed according to the method of this embodiment.

The LED mask layer 30 may have a thickness in a direction normal to the first semiconductor layer 20 such that the monolithic LED stack is formed within the LED well 31. The thickness of the LED mask layer 30 will depend on the desired thickness of the monolithic LED stack 40. For example, in some embodiments, the thickness of the LED mask layer is provided to be at least 100 nm thicker than the thickness of the monolithic LED stack 40. In some embodiments, the thickness of the LED mask layer is provided to be at least: 500 nm, 700 nm, 1 µm, 2 µm or 5 µm thicker than the thickness of the monolithic LED stack 40. In some embodiments, the thickness of the LED mask layer may be at least 2 µm. In other embodiments, the thickness of the LED mask layer 30 may be at least: 3 µm, 5 µm, or 10 µm. In some embodiments, the thickness of the LED mask layer 30 may be no greater than: 30 µm. Thus, the LED mask layer 30 may be provided in an efficient manner and also so as to not create excessive shadowing of the LED well 31.

Figure 3:
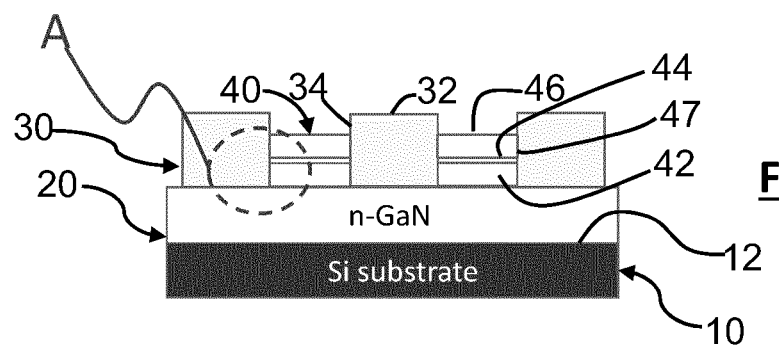
FIG. 3 shows a diagram of monolithic LED stack formed in each of the LED wells of the structure of FIG. 2.

In step 104, a monolithic LED stack 40 may be formed in each LED well 31. The monolithic LED stack 40 is formed on the exposed top surface 22 of the first semiconductor layer. As such, the monolithic LED stack is in electrical contact with the first semiconductor layer 20. An example of the monolithic LED stacks 40 formed according to this step 104 is shown in FIG. 3.

Each monolithic LED stack 40 comprises a plurality of layers. Each layer may comprise a Group III-nitride. In particular, the monolithic LED stack 40 comprises an n-type semiconductor layer 42, an active layer 44 and a p-type semiconductor layer 46. As shown in FIG. 3, the sidewalls of each of the layers forming the monolithic LED stack 40 form the LED stack sidewalls 47. The LED stack sidewalls 47 of each monolithic stack extend from the top surface 22 of the first semiconductor layer 20 to a top surface of the monolithic LED stack (e.g. a top surface of the p-type semiconductor layer 46).

The n-type semiconductor layer 42 comprises a Group III-nitride formed on the first semiconductor layer. The n-type semiconductor layer 42 may comprise a Group III-nitride. The n-type semiconductor layer 42 may be doped with a suitable electron donor, for example Si, or Ge. The n-type semiconductor layer 42 is deposited on the exposed portion of the first semiconductor layer 20 as a continuous layer. The n-type semiconductor layer 42 may improve the charge carrier injection into the first active layer 21 of the first LED.

The n-type semiconductor layer 42 may have a thickness in a direction normal to the first semiconductor layer surface 22 of at least 100 nm. In some embodiments, the n-type semiconductor layer 42 may have a thickness in a direction normal to the first semiconductor layer surface 22 of no greater than 2 µm.

The active layer 44 is formed on the first semiconductor layer 42. The active layer comprises one or more quantum well sub-layers. The active layer comprises a Group III-nitride. In the embodiment of FIG. 3, the active layer 44 may comprise one or more quantum well layers (not shown). As such, the active layer 44 may be a multiple quantum well layer. The quantum well layers within the active layer 44 may comprise a Group III-nitride semiconductor, preferably a Group III-nitride alloy including In. For example, in the embodiment of FIG. 3 the active layer 44 may comprise alternating layers of GaN and $In_xGa_{1-x}N$, where $0<X\leq1$. In particular, in some embodiments, the active layer 42 may comprise $In_xGa_{1-x}N$ layers where $0<X\leq0.5$. As such, the active layer 42 of the LED precursor in some embodiments may be configured to output light having a wavelength of at least 360 nm, and no greater than 650 nm. The thickness and In content (X) of the quantum well layer may be controlled in order to control the wavelength of light generated by the active layer 42. The active layer 44 may be deposited using any suitable process for the fabrication of Group III-nitride thin films, for example, Metal Organic Chemical Vapour Deposition (MOCVD), hydride vapour phase epitaxy (HVPE), remote plasma chemical vapour deposition (RPCVD) or Molecular Beam Epitaxy (MBE). For example, in some embodiments, the active layer 44 may have a total thickness (i.e. all the layer of the active layer 40 combined) in the direction normal to the first semiconductor surface 22 of at least 50 nm. In some embodiments, the total thickness of the active layer 44 may be no greater than 300 nm.

The p-type semiconductor layer 46 comprises a Group III-nitride. For example, the p-type layer may comprise GaN. The p-type semiconductor layer 46 is formed on the active layer. The p-type semiconductor layer 46 may be doped with a suitable electron acceptor, for example Mg. The p-type semiconductor layer 46 may have an acceptor density (NA) of about $10^{17}$-$10^{21}$ cm$^{-3}$. The p-type semiconductor layer 46 may be formed as a continuous layer covering a substantial portion (e.g. all) of the exposed surface of the active layer 4 in each of the LED wells 31. In some embodiments, the p-type semiconductor layer 46 may have a thickness in the direction normal to the first semiconductor layer 22 of at least 50 nm. In some embodiments, the thickness of the p-type semiconductor layer 46 in the direction normal to the first semiconductor layer 22 may be no greater than 400 nm.

In some embodiments, each of the layers of the monolithic LED stack 40 may be deposited using any suitable process for the fabrication of Group III-nitride thin films, for example, Metal Organic Chemical Vapour Deposition (MOCVD), or Molecular Beam Epitaxy (MBE).

It will be appreciated that the layers of the monolithic LED stack 40 will substantially form on the exposed surface of the first semiconductor layer 20, and not form on the surfaces of the LED mask layer 30. Consequently, the monolithic LED stacks 40 will be formed within the LED wells 31 defined by the LED mask layer 30. As the layers of the monolithic LED stack 40 are formed in the LED well 31, the LED stack sidewalls of the monolithic LED stack conform to the LED well sidewalls of the LED mask layer 30. That is to say, the LED well sidewalls 34 are configured to shape the LED stack sidewalls 47 of the monolithic LED stack as it is grown. Thus, the LED well sidewalls of the LED wells 31 may be used to control the shape of the monolithic LED stack 40 grown. In particular, a variety of different shapes and profiles for the LED stack sidewalls may be achieved as explained in more detail below.

It will be appreciated that the total thickness of the monolithic LED stack 40 will depend on the number of layers forming the monolithic LED stack and the thicknesses of the layers. For example, the monolithic LED stack 40 may have a thickness in the direction normal to the first semiconductor layer surface 22 of at least 400 nm. In some embodiments, the monolithic LED stack 40 may have a thickness in the direction normal to the first semiconductor layer surface 22 of no greater than 2.7 µm.

Figure 4:
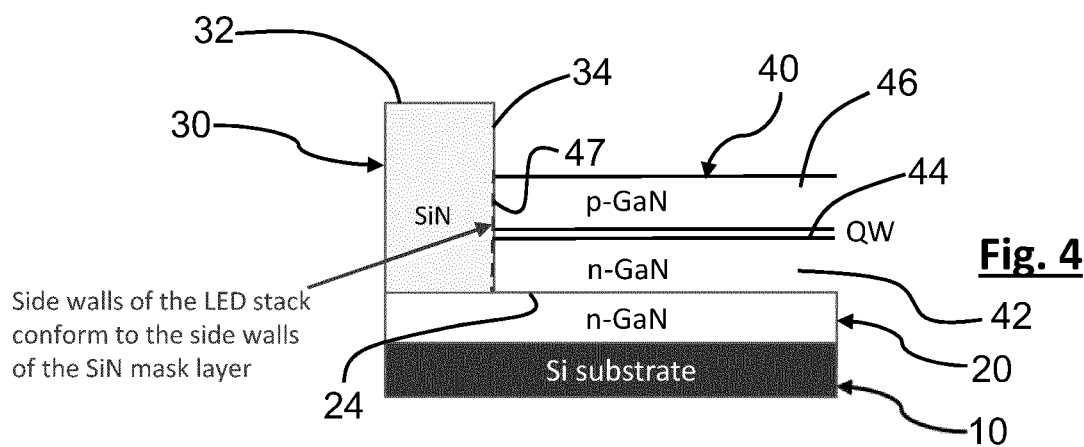
FIG. 4 shows a detailed view of part A of FIG. 3 in which the interface between the LED stack sidewalls and the LED well sidewalls is shown according to a first growth mechanism.
Figure 5:
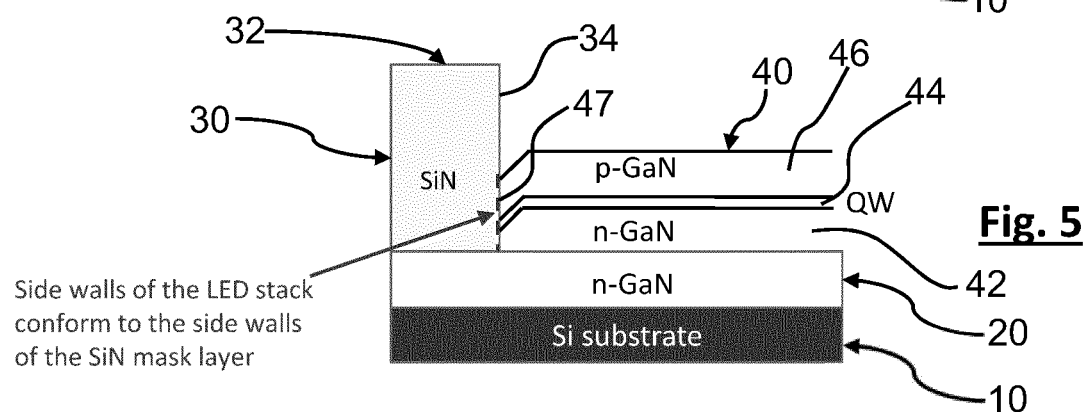
FIG. 5 shows a detailed view of part A of FIG. 3 in which the interface between the LED stack sidewalls and the LED well sidewalls is shown according to a second growth mechanism.

FIGS. 4 and 5 show detailed views of two possible interfaces between the LED well sidewalls 34 and the monolithic LED stack 40. In FIG. 4, the layers of the monolithic LED stack 40 have been grown in generally uniform layers which each extend across the LED well 31. As such, in the embodiment of the FIG. 4, the growth rate of each of the layers of the monolithic LED stack is substantially the same across all regions of the LED well 31. In particular, the growth rate of the layers of the monolithic LED stack 40 is generally the same in regions of the LED well 31 close to the LED well sidewalls 34 as it is in regions towards the centre of the LED well sidewall 31.

In the embodiment of FIG. 5, the layers of the monolithic LED stack 40 towards the LED well sidewalls 34 have a different thickness (normal to the first semiconductor layer 20) than towards the centre of the LED well 31. As shown in FIG. 5, the layers of the monolithic LED stack 40 may be thinner at a region proximal to the LED well sidewalls 34 due to a lower growth rate. The layers 42, 44, 46 of the monolithic LED stack may grow along an inclined plane in this region due to the wurzite crystal structure of the Group III-nitride layer. In FIG. 5, the LED stack sidewall 47 extends in a direction generally normal to the first semiconductor layer 20 such that it conforms to the LED well sidewall 34. A top surface of the p-type semiconductor layer 46 extends away from the LED well sidewall 34.

Figure 10:
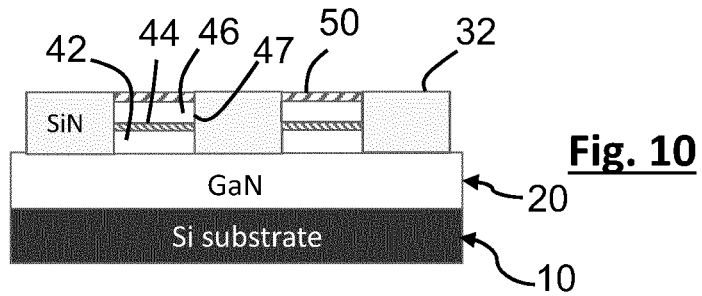
FIG. 10 shows a diagram of the structure of FIG. 9 following a chemical mechanical polishing process.
Figure 11:
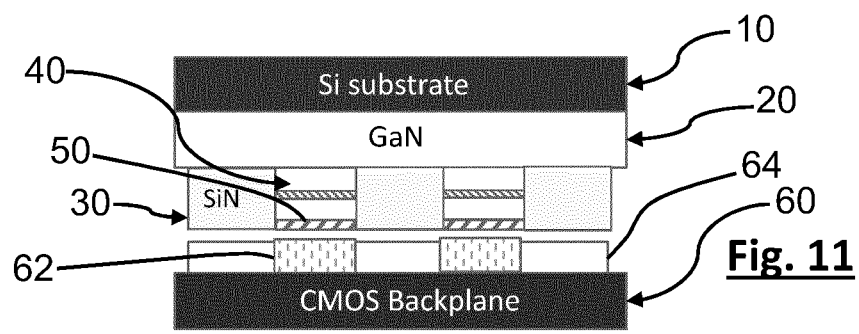
FIG. 11 shows a diagram of a backplane electronics substrate being aligned with the structure of FIG. 10

In both FIGS. 4 and 5, it will be appreciated that the LED stack sidewalls 47 conform to the LED well sidewalls 34 of the LED well. In FIGS. 10 and 11, each of the layers of the monolithic LED stack 40 is terminated by the LED well sidewalls 34. That is to say, each monolithic LED stack 40 is separated from other monolithic LED stacks 40 by the LED mask layer 30. As such, the layers of each monolithic LED stack 40 are discontinuous with the layers of other monolithic LED stacks 40. Accordingly, the as-formed layers of each monolithic LED stack 40 are suitably electronically isolated from other monolithic LED stacks 40 which may be formed on the same first semiconductor layer 20 to for the formation of a LED. As such, the method of forming a LED precursor according to this embodiment may reduce, or eliminate, processing steps relating to electrically isolating as-deposited layers of an LED stack during the formation of an LED precursor.

In some embodiments, it will be appreciated that the mask layer 30 also acts as a passivation layer for the LED stack sidewalls 47. Thus, as shown in FIGS. 4 and 5, the mask layer 30 will passivate surface states on the LED stack sidewalls 47. Accordingly, LED precursors formed according to the method of this embodiment may incorporate a passivation layer as part of the fabrication process, thereby making fabrication of the LED precursor more efficient.

In FIGS. 2-5, the LED well sidewalls 34 are depicted as extending generally normal to the first semiconductor layer 20. In other embodiments, the LED well sidewalls 34 may be configured to impart different sidewall profiles on the LED stack sidewalls 47. Examples of such LED well sidewalls are shown in FIGS. 6-8.

Figure 6:
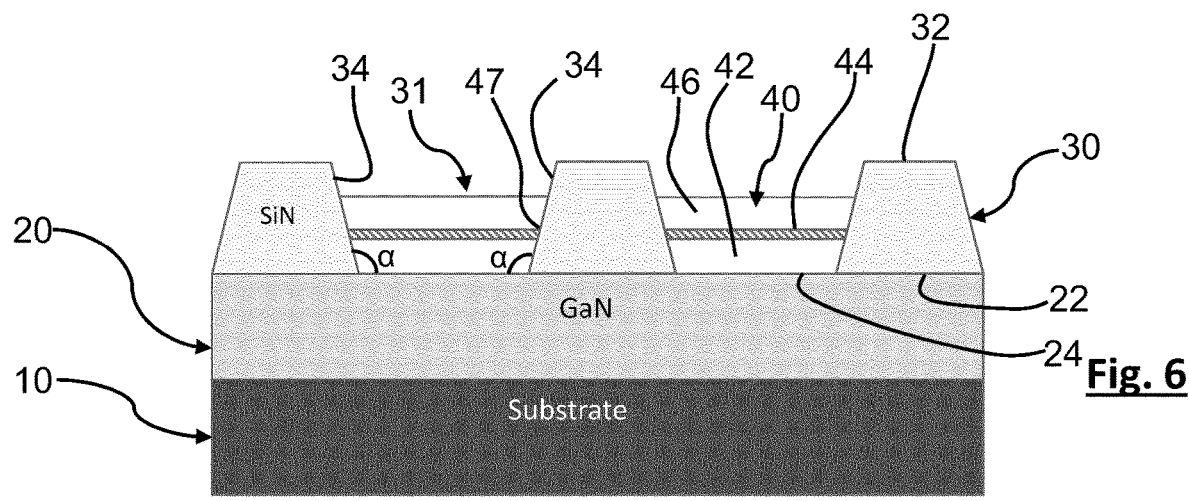
FIG. 6 shows a diagram of a LED well sidewall having an obtuse angle of inclination.
Figure 7:
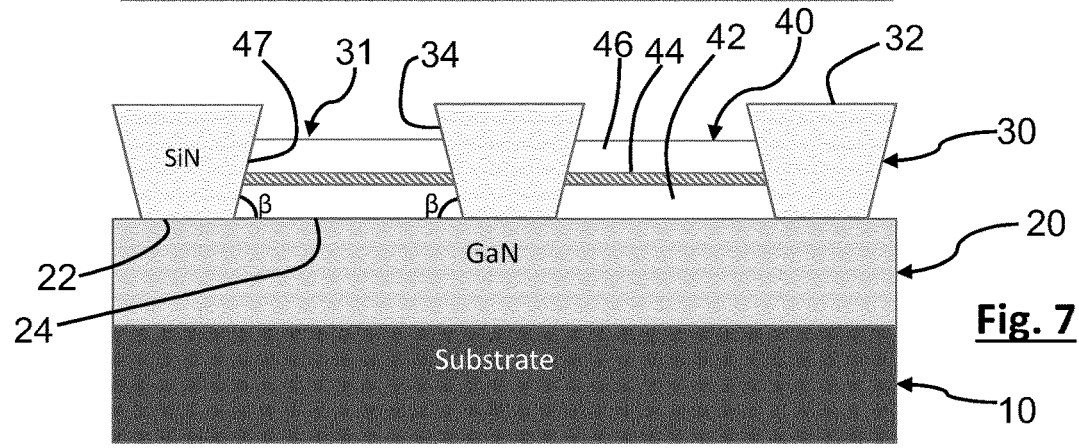
FIG. 7 shows a diagram of a LED well sidewall having an acute angle of inclination.
Figure 8:
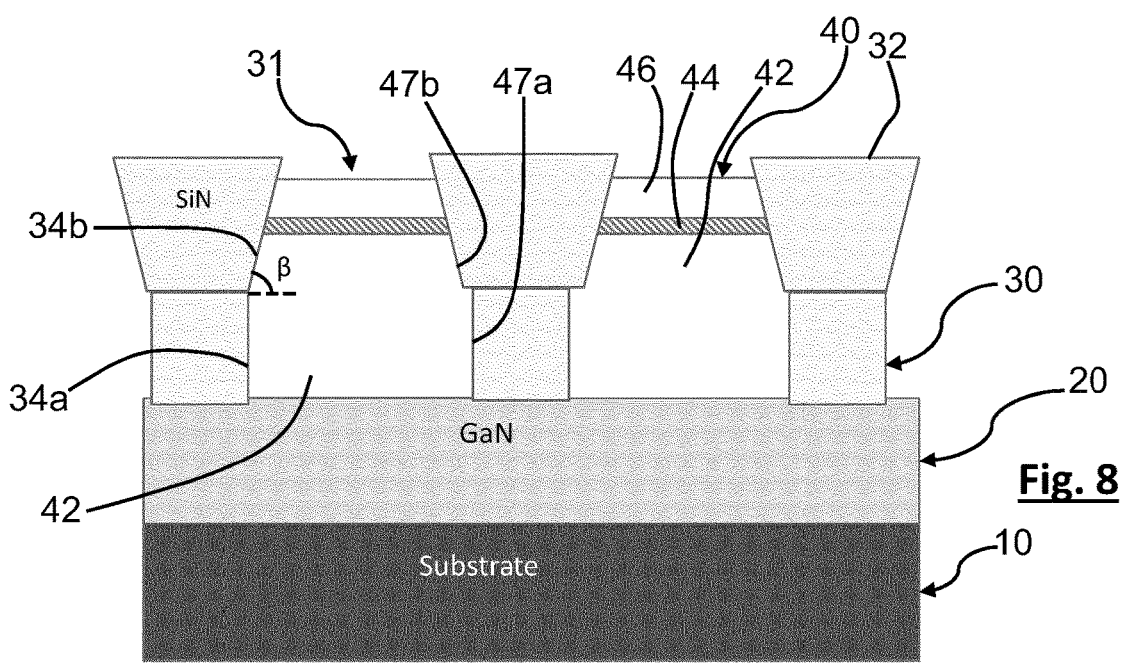
FIG. 8 shows a diagram of a compound LED well sidewall having a first LED well sidewall portion and a second LED well sidewall portion.
Figure 9:
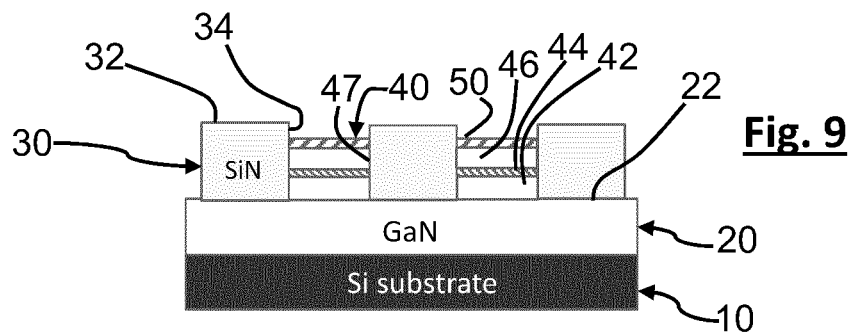
FIG. 9 shows a diagram of contact layers formed on the monolithic LED stacks of the structure of FIG. 3.

In FIGS. 6 and 7, a portion of the LED well sidewalls 34 extending between the first semiconductor layer 20 and the top surface 32 of the LED mask layer 30 are inclined with respect to the direction normal to the top surface of the first semiconductor layer 20. In FIGS. 6 and 7 the LED well sidewalls 34 have the same inclination on all surfaces of the LED mask layer 30 which define the LED well 31. Of course, in other embodiments, the inclination of the LED well sidewalls 34 may vary around the perimeter of the LED well 31.

In FIG. 6, the LED well sidewalls 34 are inclined with to the normal (of the first semiconductor layer 20) such that a cross sectional area of the LED well 31 in a plane parallel to the top surface 22 of the first semiconductor layer 20 increases in the direction from the top surface 22 of the first semiconductor layer 20 towards the top surface of the LED mask layer 32. In FIG. 6, the LED sidewalls 34 are inclined at an obtuse angle (a) between the LED well sidewalls 34 and the exposed surface 24 of the first semiconductor layer 20.

In FIG. 7, the LED sidewalls 34 are inclined with to the normal (of the first semiconductor layer 20) such that a cross sectional area of the LED well 31 in a plane parallel to the top surface 22 of the first semiconductor layer 20 decreases in the direction from the top surface of the first semiconductor layer towards the top surface 32 of the LED mask layer 30. In FIG. 7, the LED sidewalls 34 are inclined at an acute angle (β) between the LED well sidewalls 34 and the exposed surface 24 of the first semiconductor layer 20.

In FIG. 8, the LED well sidewalls 34 have a compound profile comprising a plurality of LED well sidewall portions. As such, the LED well sidewalls 34 may comprise a first LED well sidewall portion 34a which extends in a first direction, and a second LED well sidewall portion 34b which extends in a second direction. In the embodiment of FIG. 8, the first LED sidewall portion 34a extends from the first semiconductor layer 20 to the second LED sidewall portion 34b and the second LED sidewall portion 34b extends from the first LED sidewall portion 34a to the top surface 32 of the LED mask layer 30. As shown in FIG. 8, the first LED sidewall portion 34a extends in a first direction which is generally normal to the first semiconductor layer. The second LED well sidewall portion 34b extends in the second direction which is inclined relative to the normal. It will be appreciated that FIG. 8 is one possible example of a compound profile. In other embodiments, a compound profile may be formed from a plurality of LED well sidewall portions. Each of the LED well sidewall portions may extend in a respective direction either normal, or inclined (acute or obtuse) to the normal to form any desired compound profile.

In FIG. 8, the active layer 44 of the monolithic LED stack 40 is arranged along a section of the second LED well sidewall portion 34b. The n-type semiconductor layer 42 is arranged to fill the first LED well sidewall portion 34a. As such, the monolithic LED stack 40 comprises an elongate columnar portion of the n-type semiconductor layer which extends between the active layer 44 and the first semiconductor layer 20 (towards a light emitting surface 28). Accordingly, the n-type semiconductor layer 42 acts as a light guiding feature for the LED precursor to help improve the light extraction efficiency and/or the collimation of the light extracted from the LED.

As such, in FIG. 8 a collimating portion of each LED well sidewall 34a extends from the first semiconductor layer 20 in a direction generally normal to the first semiconductor layer 20. This collimating portion results in a collimating portion of the LED stack sidewall 47a being formed. The collimating portion of the LED stack sidewall extends from the first semiconductor layer 20 in a direction generally normal to the first semiconductor layer 20. The LED well sidewall also comprises a tapered portion of the LED well sidewall 34b which extends between the collimating portion 34a and the top surface 32 of the LED mask layer 30. The tapered portion 34a is inclined at an acute angle such that a cross sectional area of the LED well 31 in a plane parallel to the top surface 22 of the first semiconductor layer 20 decreases in the direction from the top surface of the first semiconductor layer towards the top surface of the LED mask layer 30. This results in the formation of a tapered portion of the LED stack sidewalls 47b which are inclined at an acute angle. The tapered portion of the LED stack sidewalls 47b extend from the collimating portion 47a to the top surface of the monolithic LED stack 40.

Compound profiles for the LED mask sidewalls may be formed using lithographic techniques known to the skilled person.

Although the examples of the LED mask sidewalls 34 shown in FIGS. 6-8 comprise generally planar (i.e. flat) surfaces, it will be appreciated that in other embodiments the LED mask sidewalls 34 may comprise concave or convex portions. Consequently, the LED stack sidewalls 47 may also comprise concave or convex portions.

By depositing the monolithic LED stack 40 in the LED well 31, a LED precursor may be provided. Following steps 101-104, the LED precursor may be further processed to form a LED through the addition of electrical contacts and associated circuitry. Steps 105 through 107 of FIG. 1 outline additional process steps for the formation of a LED.

Once the monolithic LED stack 40 is formed in the LED well 31, step 105 of the method comprises forming contacts to the monolithic LED stack and planarising the contact surface for substrate bonding. Step 105 may be performed in various ways depending on the degree to which the LED mask layer 30 is further processed. Two possible methodologies will now be described. In a first methodology, as shown in FIGS. 9-13 the LED well sidewalls 34 are preserved. In a second methodology, as shown in FIGS. 14-18, the LED mask layer 30 is removed prior to deposition of contact layers.

In the first methodology, an anode contact layer 50 may be formed on the top surface of the p-type semiconductor layer 46. The anode contact layer may comprise any suitable material for forming an Ohmic contact to the p-type semiconductor layer 46.

The anode contact layer 50 may be patterned using any suitable patterning technique. For example, the anode contact layer 50 may be patterned using a lithographic process. In the example shown in FIG. 9, the anode contact layer 50 is patterned to cover the top surface of each monolithic LED stack 40. The anode contact layer 50 is deposited in the LED well 31. As such, the top surface of the LED mask layer 30 extends in the direction normal to the first semiconductor layer beyond the anode contact layer 50. By depositing the anode contact layer 50 in the LED well, the anode contact layer forms part of the monolithic LED stack 40.

Following deposition of the anode contact layer 50, the LED precursor is planarised. Planarising the LED precursor provides a surface of the LED precursor which is suitable for bonding to a backplane electronics substrate. According to the first methodology, the LED precursor is planarised using a Chemical Mechanical Polishing (CMP) process. FIG. 10 shows a diagram of the LED precursor of FIG. 9 which has been subjected to CMP. As shown in FIG. 10, the part of the LED mask layer which extended in the direction normal to the first semiconductor layer beyond the anode contact layer 50 has been removed. As such, the CMP process removes a second portion of the LED mask layer from the top surface of the LED mask layer such that a remaining first portion of the LED mask layer forms a planarised surface with a top surface of the monolithic LED stack. Accordingly, following CMP the top surface of the LED mask layer 30 forms a substantially continuous, planar surface with the top surface 52 of the anode contact layer 50 (i.e. the top surface of the monolithic LED stack 40).

The chemical mechanical polishing process may be any known CMP process suitable for use with Group III-nitrides and the like.

Once the planarised surface is formed, the LED precursor can be bonded to a backplane electronics substrate 60 (step 106 in FIG. 1). FIG. 11 shows an example of a backplane electronics substrate 60 which is being aligned with the LED precursor for substrate bonding. The backplane electronics substrate comprises a plurality of contact pads 62 and a dielectric bonding layer 64.

The contact pads 62 may be arranged on the backplane electronics substrate in a pattern corresponding to the arrangement of the anode contacts/monolithic LED stacks 40 on the first semiconductor layer 20. The contact pads 62 are configured to form an electrical connection between the backplane electronics substrate 60 and the anode contacts 50. The contact pads 60 may be arranged to form a diffusion bond, direct bond or a eutectic bond with the anode contacts 50 during the bonding process.

The dielectric bonding layer 64 is arranged around the contact pads 62 on the backplane electronics substrate 60. The dielectric bonding layer may be configured to form a bond with the LED mask layer 30 during the bonding process such that a hybrid substrate bond is formed. Further information regarding a suitable hybrid bonding process is explained in at least GB 1917182.6.

The substrates may be bonded together by the application of pressure and/or temperature. For example, in some embodiments, following alignment, the substrates may be pressed together in a press at a temperature of at least 100°. In some embodiments, a pressure of at least 10 kN may be applied. In some embodiments, a compressive force of at least 20 kN, 30 kN, or 40 kN may be applied. By applying a larger compressive force to the substrates to be bonded, the reliability of forming the bond between substrates may be improved. In some embodiments, the press may apply a compressive force of no greater than 45 kN in order to reduce the risk of substrate fracture or undesirable deformation of the contacts pads 62 and anode contacts 50 during bonding.

Figure 12:
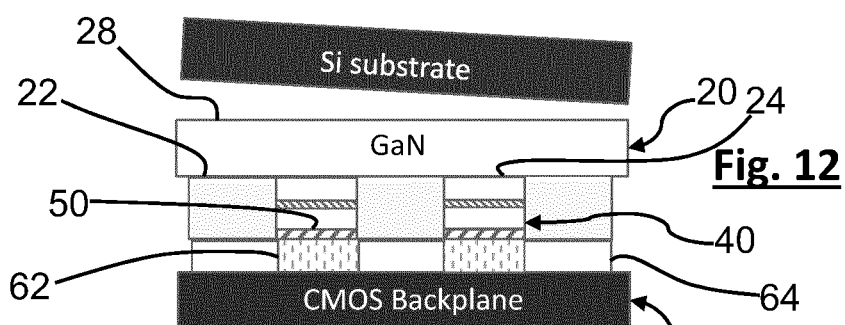
FIG. 12 shows a schematic diagram of the Si substrate being removed from the structure of FIG. 11 following substrate bonding.

Once the LED precursor is bonded to the backplane electronics substrate 60, the substrate 10 may be removed (step 107 in FIG. 1). FIG. 12 shows a schematic diagram of the substrate 10 being removed to expose a light emitting surface 28 of the first semiconductor layer 20.

Figure 13:
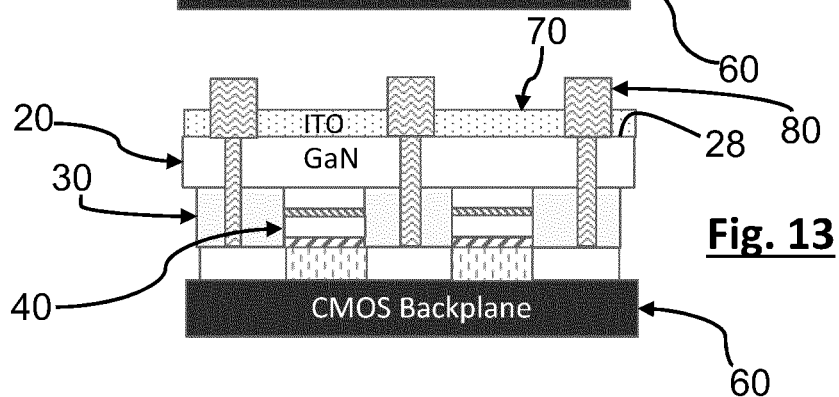
FIG. 13 shows a diagram of the structure of FIG. 12 with further light extracting features formed on the light emitting surface of the first semiconductor layer.

Following removal of the substrate, the light emitting surface 28 of the first semiconductor layer 20 may be subjected to further processing steps. For example, in FIG. 13 a common cathode contact 70 is formed on the first semiconductor layer 20. As the common cathode contact 70 is formed on the light emitting surface 28, the common cathode in this embodiment comprises a material which is transparent to visible light. For example, the common cathode contact 70 may comprise Indium Tin Oxide, or any other suitable transparent conducting oxide. Of course, it will be appreciated that FIG. 13 is only one example of a possible arrangement of a common cathode contact 70. In other embodiments, electrical contact to the first semiconductor layer 20 could be made through the LED mask layer 30 to the back plane electronics substrate 60.

As shown in FIG. 13, further light guiding features 80 may be formed following substrate removal. In FIG. 13, light guiding features 80 are formed around each monolithic LED stack 40 to prevent cross-talk between LEDs. In some embodiments, the light guiding features 80 comprise a one or more metal layers. For example, the light guiding features may comprise Al, Ag, Au, or any other suitable metal. In some embodiments, the light guiding features may comprise a reflector, for example a distributed Bragg reflector (DBR). Thus, it will be appreciated that an array of LEDs may be formed according to the first methodology outlined above.

According to the second methodology, an array of LEDs may also be provided. The second methodology is shown in FIGS. 14-18.

Figure 14:
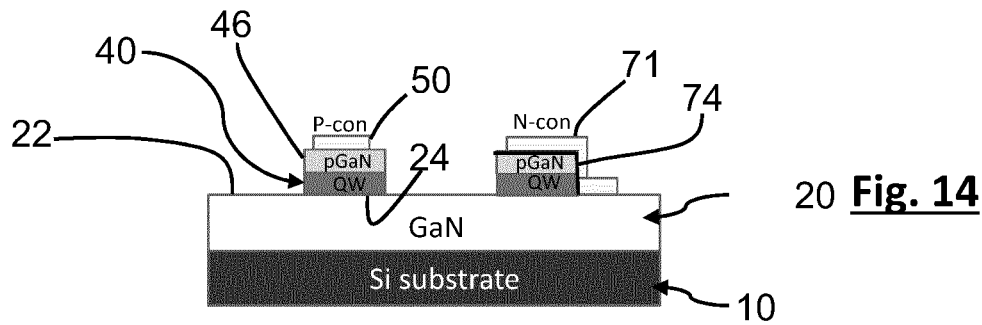
FIG. 14 shows a diagram of contact layers formed on the monolithic LED stacks of the structure of FIG. 3 following removal of the LED mask layer.
Figure 15:
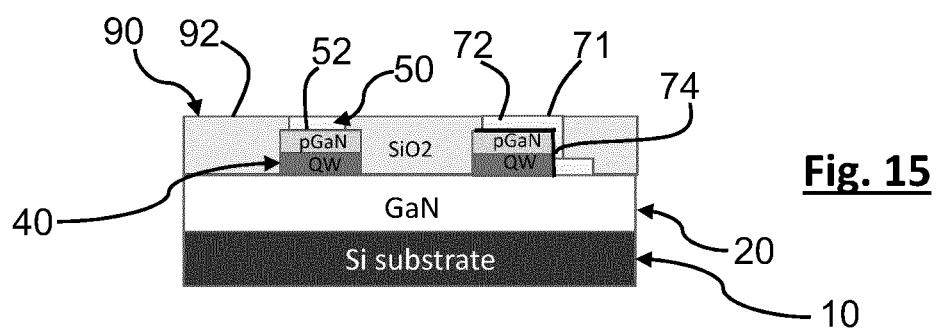
FIG. 15 shows a diagram of a gap-filling insulator formed on the structure of FIG. 14.

As shown in FIG. 14, the LED mask layer 30 may be selectively removed following the formation of the monolithic LED stack 40. In the embodiment of FIG. 14, substantially all of the LED mask layer 30 is removed. As such, the LED stacks sidewalls 47 are exposed during the intermediate processing step shown in FIG. 14.

Contacts to the p-type semiconductor layer 46 and the first semiconductor layer 20 may then be formed. As shown in FIG. 14, an anode contact 50 may be formed on the top surface of the p-type semiconductor layer 46. The anode contact 50 may comprise similar materials to the anode contact 50 discussed above for the first methodology.

A cathode contact 71 may also be formed which is configured to make electrical contact to the first semiconductor layer 20. An insulating layer 74 may be provided over at least part of the monolithic LED stack to provide electrical isolation between the cathode contact 71 and the monolithic LED stack 40 as shown in FIG. 14.

Following the formation of the contacts (anode contact 50 and cathode contact 71), a gap-filling insulator 90 may be formed in the voids between the monolithic LED stacks 40. As such, the gap-filling insulator fills the remaining voids left behind following removal of the LED mask layer. The gap filling insulator may be deposited comprising a top insulator surface 92 which forms a substantially continuous planar surface (i.e. a flat surface) with the top surfaces 52, 72 of the anode contacts 50 and the cathode contacts 71 respectively.

The gap-filling insulator may be configured to fill voids between the monolithic LED stacks 40 following removal of the LED mask layer 30. The gap-filling insulator comprises an insulating material to ensure that each of the monolithic LED stacks are not short-circuited together. The gap filling insulator also acts as a passivation layer for the LED stacks sidewalls 47 of each monolithic LED stack 40. The gap-filling insulator 90 may comprise $SiO_2$, $SiN_x$ or any other suitable insulator. The gap-filling insulator 90 may be formed, for example, through a chemical vapour deposition method or other suitable deposition technology.

Figure 16:
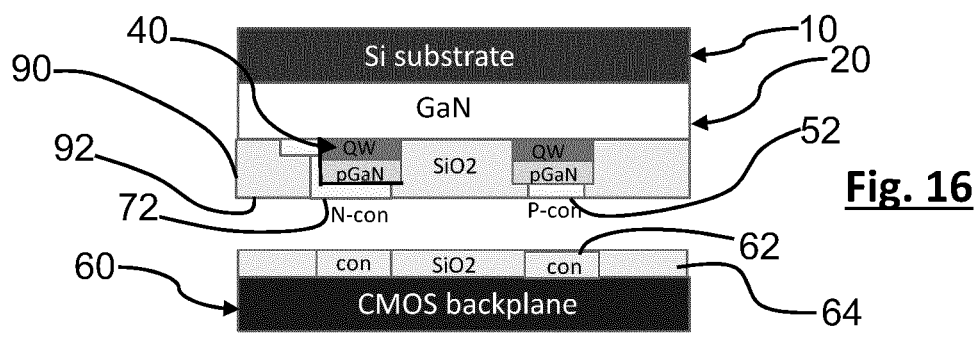
FIG. 16 shows a diagram of a backplane electronics substrate being aligned with the structure of FIG. 15.

Once the planarised surface is formed, the LED precursors may be bonded to a backplane electronics substrate 60 (step 106 in FIG. 1). The process for bonding the LED precursors to a backplane substrate is shown in schematically in FIG. 16. In FIG. 16 a backplane electronics substrate 60 is being aligned with the anode contact and cathode contacts on the first semiconductor layer 20. The process for bonding the two substrates together may be performed in a similar manner to the methodology described above.

Figure 17:
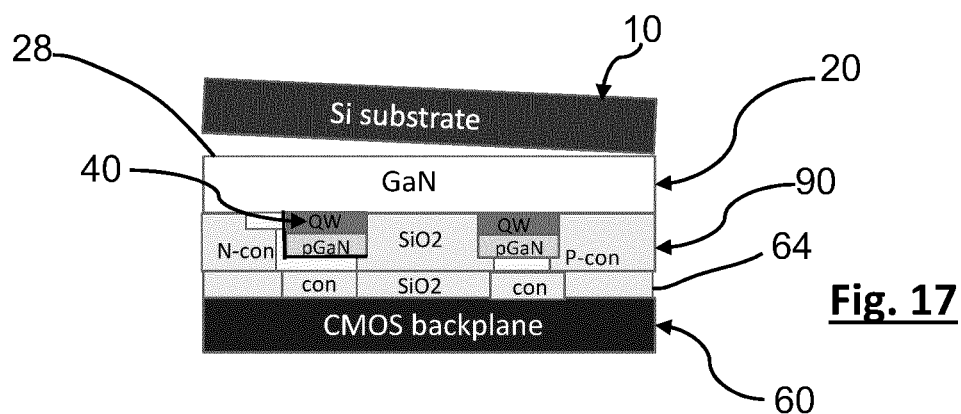
FIG. 17 shows a schematic diagram of the Si substrate being removed from the structure of FIG. 16 following substrate bonding.

Following bonding of the substrates, the substrate 10 may be removed from the first semiconductor layer 20 (step 107 in FIG. 1). A schematic diagram of such a process is shown in FIG. 17. The steps for performing this step may be substantially the same as described above for the first methodology. Following substrate 10 removal, the remaining structure comprises an array of LEDs (i.e. a LED array).

Figure 18:
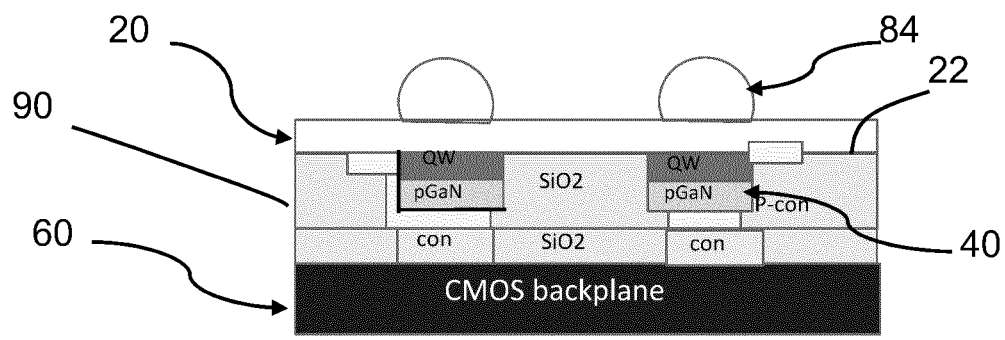
FIG. 18 shows a diagram of the structure of FIG. 17 with further light extracting features formed on the light emitting surface of the first semiconductor layer.

In FIG. 18, additional light guiding features (i.e. lens 84) may be formed on the light emitting surface of the first semiconductor layer 20. For example, the light emitting surface of the first semiconductor layer may be further patterned or shaped. The light guiding features 84 may comprise collimating features such as lens 84 to improve light extraction from the LED.

Figure 19:
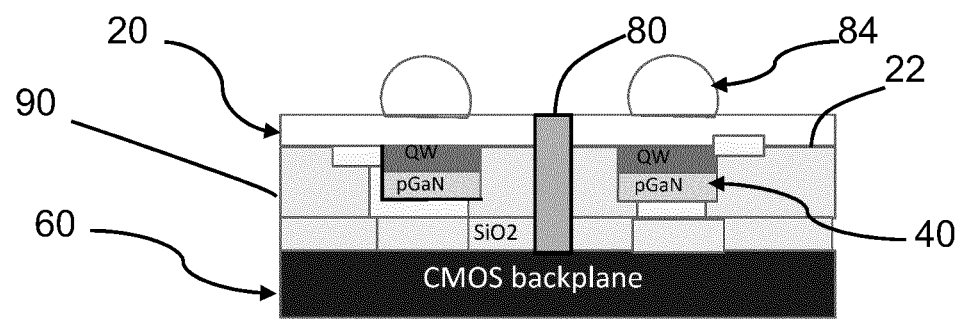
FIG. 19 shows a diagram of a LED including a cross talk reducing feature.

In FIG. 19, the embodiment of FIG. 18 is further processed to include a light guiding feature 80 for reducing cross-talk (i.e. a cross talk reducing feature). The cross talk reducing feature may be provided surrounding each LED to reduce or prevent cross-talk between LEDs. The light guiding features 80 may be provided in a similar manner to the light guiding features of FIG. 13.

Accordingly, an array of LEDs may be formed from an array of LED precursors according to methods of this disclosure.

The invention claimed is:

1. A method of forming a monolithic light emitting diode (LED) precursor, the method comprising:
    providing a substrate having a top surface;
    forming a first semiconductor layer comprising a Group III-nitride on the top surface of the substrate;
    selectively masking the first semiconductor layer with a LED mask layer, the LED mask layer comprising an aperture defining a LED well through a thickness of the LED mask layer to an unmasked portion of the first semiconductor layer, the LED well comprising LED well sidewalls extending from a top surface of the first semiconductor layer to a top surface of the LED mask layer;
    wherein a collimating portion of each LED well sidewall extending from the first semiconductor layer extends in a direction generally normal to the first semiconductor layer; and
    a tapered portion of each LED well sidewall extending between the collimating portion and the top surface of the LED mask layer is inclined such that a cross sectional area of the LED well in a plane parallel to the top surface of the first semiconductor layer decreases in the direction from the top surface of the first semiconductor layer towards the top surface of the LED mask layer; and
    selectively forming a monolithic LED stack within the LED well on the unmasked portion of the first semiconductor layer, the monolithic LED stack comprising:
        a n-type semiconductor layer comprising a Group III-nitride formed on the first semiconductor layer;
        an active layer formed on the n-type semiconductor layer comprising one or more quantum well sub-layers, the active layer comprising a Group III-nitride; and
        a p-type semiconductor layer comprising a Group III-nitride formed on the active layer;
    wherein LED stack sidewalls of the monolithic LED stack extending from the top surface of the first semiconductor layer conform to the LED well sidewalls of the LED mask layer.

2. A method according to claim 1, wherein
    selectively masking the first semiconductor layer with a LED mask layer comprises depositing the LED mask layer across the top surface of the first semiconductor layer; and
    selectively removing a first portion of the LED mask layer through a thickness of the LED mask layer to form the LED well.

3. A method according to claim 1, further comprising:
    removing a second portion of the LED mask layer from the top surface of the LED mask layer such that the LED mask layer forms a planarised surface with a top surface of the monolithic LED stack.

4. A method according to claim 3, wherein the second portion of the LED mask layer is removed using a polishing process.

5. A method according to claim 1, further comprising:
    selectively removing all of the LED mask layer following the forming of the monolithic LED stack.

6. A method according to claim 5, further comprising depositing a gap filling insulator on the top surface of the of the first semiconductor layer surrounding the monolithic LED stack, the gap filling insulator forming a planarised surface with a top surface of the monolithic LED stack.

7. A method according to claim 3, further comprising:
    bonding the planarised surface of the LED precursor to a further substrate comprising backplane electronic devices.

8. A method according to claim 7, further comprising:
    removing the substrate from the first semiconductor layer.

9. A method according to claim 1, wherein the LED mask layer comprises a dielectric.

10. A method according to claim 1, wherein a cross sectional area of the LED well on the first semiconductor layer is no greater than 100 μm×100 μm.

11. A method of forming a LED array precursor comprising:
    forming a plurality of LED precursors on the substrate according to the method of claim 1.

12. A method according to claim 9, wherein the dielectric comprises $SiO_2$, or $SiN_x$.

* * * * *